(12) United States Patent
Sarov et al.

(10) Patent No.: US 11,239,054 B2
(45) Date of Patent: Feb. 1, 2022

(54) MULTI-BEAM PARTICLE BEAM SYSTEM

(71) Applicant: Carl Zeiss MultiSEM GmbH, Oberkochen (DE)

(72) Inventors: Yanko Sarov, Aalen (DE); Jan Horn, Munich (DE); Ulrich Bihr, Kirchheim/Dirgenheim (DE); Christof Riedesel, Aalen (DE); Erik Essers, Aalen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 17/098,965

(22) Filed: Nov. 16, 2020

(65) Prior Publication Data

US 2021/0066037 A1    Mar. 4, 2021

Related U.S. Application Data

(63) Continuation of application No. 16/277,572, filed on Feb. 15, 2019, now Pat. No. 10,854,423.

(30) Foreign Application Priority Data

Feb. 16, 2018 (DE) .......................... 102018202421.9

(51) Int. Cl.
*H01J 37/317* (2006.01)
*H01J 37/04* (2006.01)
(Continued)

(52) U.S. Cl.
CPC ........ *H01J 37/3177* (2013.01); *H01J 37/045* (2013.01); *H01J 37/10* (2013.01); *H01J 37/241* (2013.01)

(58) Field of Classification Search
CPC ........ H01J 37/045; H01J 37/153; H01J 37/24; H01J 37/241; H01J 37/3177
See application file for complete search history.

(56) References Cited

U.S. PATENT DOCUMENTS

| 4,130,761 A | 12/1978 | Matsuda |
| 4,153,843 A | 5/1979 | Pease |

(Continued)

FOREIGN PATENT DOCUMENTS

| DE | 10 2013 208 446 A1 | 6/2014 |
| DE | 10 2013 014 976 A1 | 3/2015 |

(Continued)

OTHER PUBLICATIONS

German Office Action, with translation thereof, for corresponding DE application No. 10 2018 202 421.9 dated Oct. 29, 2018.

*Primary Examiner* — David E Smith
(74) *Attorney, Agent, or Firm* — Fish & Richardson P.C.

(57) ABSTRACT

A multi-beam particle beam system includes a multi-aperture plate having a multiplicity of apertures. During operation, one particle beam of the plurality of particle beams passes through each of the apertures. A multiplicity of electrodes are insulated from the second multi-aperture plate to influence the particle beam passing through the aperture. A voltage supply system for the electrodes includes: a signal generator to generate a serial sequence of digital signals; a D/A converter to convert the digital signals into a sequence of voltages between an output of the D/A converter and the multi-aperture plate; and a controllable changeover system, which feeds the sequence of voltages successively to different electrodes.

21 Claims, 11 Drawing Sheets

(51) Int. Cl.
*H01J 37/24* (2006.01)
*H01J 37/10* (2006.01)

(56) References Cited

U.S. PATENT DOCUMENTS

| | | | |
|---|---|---|---|
| 4,200,794 A | 4/1980 | Newberry | |
| 4,338,548 A | 7/1982 | Bono | |
| 4,742,234 A | 5/1988 | Feldman | |
| 5,144,142 A | 9/1992 | Fueki et al. | |
| 5,215,623 A | 6/1993 | Takahashi | |
| 5,864,142 A | 1/1999 | Muraki | |
| 5,892,224 A | 4/1999 | Nakasuji | |
| 5,905,267 A | 5/1999 | Muraki | |
| 5,977,548 A | 11/1999 | Oae et al. | |
| 5,981,954 A | 11/1999 | Muraki | |
| 6,107,636 A | 8/2000 | Muraki | |
| 6,118,129 A | 9/2000 | Oae et al. | |
| 6,124,599 A | 9/2000 | Muraki | |
| 6,137,113 A | 10/2000 | Muraki | |
| 6,323,499 B1 | 11/2001 | Muraki | |
| 6,333,508 B1 | 12/2001 | Katsap | |
| 6,617,595 B1* | 9/2003 | Okunuki | G21K 1/08 |
| | | | 250/398 |
| 6,633,366 B2 | 10/2003 | Jager | |
| 6,646,275 B2 | 11/2003 | Oae et al. | |
| 6,696,371 B2 | 2/2004 | Butschke | |
| 6,787,780 B2 | 9/2004 | Hamaguchi | |
| 6,804,288 B2 | 10/2004 | Haraguchi | |
| 6,818,911 B2* | 11/2004 | Tamamori | B82Y 10/00 |
| | | | 250/492.22 |
| 6,835,508 B2 | 12/2004 | Butschke | |
| 6,872,950 B2 | 3/2005 | Shimada | |
| 6,872,952 B2* | 3/2005 | Shimada | G21K 1/087 |
| | | | 250/396 R |
| 6,903,345 B2 | 6/2005 | Ono | |
| 6,903,353 B2 | 6/2005 | Muraki | |
| 6,917,045 B2 | 7/2005 | Hashimoto | |
| 6,919,574 B2 | 7/2005 | Hashimoto | |
| 6,943,349 B2 | 9/2005 | Adamec | |
| 6,953,938 B2 | 10/2005 | Iwasaki | |
| 6,965,153 B1 | 11/2005 | Ono et al. | |
| 6,992,290 B2 | 1/2006 | Watanabe | |
| 7,005,658 B2 | 2/2006 | Muraki | |
| 7,015,467 B2 | 3/2006 | Maldonado | |
| 7,060,984 B2 | 6/2006 | Nagae | |
| 7,084,411 B2 | 8/2006 | Lammer-Pachlinger | |
| 7,091,504 B2 | 8/2006 | Wieland | |
| 7,109,494 B2 | 9/2006 | Ono | |
| 7,126,141 B2 | 10/2006 | Ono | |
| 7,129,502 B2 | 10/2006 | Kruit | |
| 7,244,949 B2 | 7/2007 | Knippelmeyer | |
| 7,285,779 B2 | 10/2007 | Litman | |
| 7,375,326 B2 | 5/2008 | Sender | |
| 7,420,164 B2 | 9/2008 | Nakasuji | |
| 7,468,507 B2 | 12/2008 | Rogers | |
| 7,504,622 B2 | 3/2009 | Elyasaf | |
| 7,535,001 B2 | 5/2009 | Sender | |
| 7,601,972 B2 | 10/2009 | Nakasuji | |
| 7,619,203 B2 | 11/2009 | Elyasaf | |
| 7,696,497 B2 | 4/2010 | Rogers | |
| 8,026,495 B2 | 9/2011 | Platzgummer | |
| 8,035,082 B2 | 10/2011 | Yamazaki | |
| 8,134,135 B2 | 3/2012 | Kruit | |
| 8,350,214 B2 | 1/2013 | Otaki | |
| 8,362,425 B2 | 1/2013 | Han | |
| 8,368,030 B2 | 2/2013 | Platzgummer et al. | |
| 8,384,051 B2 | 2/2013 | Ozawa | |
| 8,598,525 B2 | 12/2013 | Zeidler | |
| 8,618,496 B2 | 12/2013 | Wieland | |
| 8,704,192 B2 | 4/2014 | Sano | |
| 8,748,842 B2 | 6/2014 | Ohashi | |
| 8,779,399 B2 | 7/2014 | Yamanaka | |
| 8,829,465 B2 | 9/2014 | Tsunoda | |
| 8,963,099 B2 | 2/2015 | Yamada | |
| 9,153,413 B2 | 10/2015 | Almogy | |
| 9,263,233 B2 | 2/2016 | Zeidler | |
| 9,336,981 B2 | 5/2016 | Knippelmeyer | |
| 9,336,982 B2 | 5/2016 | Zeidler | |
| 9,349,571 B2 | 5/2016 | Kemen | |
| 9,368,314 B2 | 6/2016 | Nakasuji | |
| 9,530,613 B2 | 12/2016 | Rogers | |
| 9,536,702 B2 | 1/2017 | Lang | |
| 9,607,805 B2 | 3/2017 | Liu | |
| 9,653,254 B2 | 5/2017 | Zeidler | |
| 9,702,983 B2 | 7/2017 | Eder | |
| 9,922,799 B2 | 3/2018 | Li | |
| 9,991,089 B2 | 6/2018 | Mueller | |
| 10,062,541 B2 | 8/2018 | Ren | |
| 10,141,160 B2 | 11/2018 | Ren | |
| 10,176,965 B1 | 1/2019 | Breuer | |
| 10,354,831 B2 | 7/2019 | Kemen | |
| 10,388,487 B2 | 8/2019 | Zeidler | |
| 10,535,494 B2 | 1/2020 | Zeidler | |
| 10,541,112 B2 | 1/2020 | Schubert | |
| 10,586,677 B1 | 3/2020 | Okada | |
| 10,600,613 B2 | 3/2020 | Zeidler | |
| 10,622,184 B2 | 4/2020 | Knippelmeyer | |
| 10,643,820 B2 | 5/2020 | Ren | |
| 10,741,355 B1 | 8/2020 | Zeidler | |
| 10,811,215 B2 | 10/2020 | Zeidler | |
| 10,854,423 B2 | 12/2020 | Sarov et al. | |
| 10,879,031 B2 | 12/2020 | Ren | |
| 10,896,800 B2 | 1/2021 | Riedesel | |
| 2002/0000766 A1 | 1/2002 | Ono et al. | |
| 2003/0085360 A1 | 5/2003 | Parker et al. | |
| 2003/0189180 A1* | 10/2003 | Hamaguchi | B82Y 10/00 |
| | | | 250/492.3 |
| 2003/0209676 A1 | 11/2003 | Loschner | |
| 2006/0289804 A1 | 12/2006 | Knippelmeyer et al. | |
| 2009/0014812 A1 | 1/2009 | Nakasuji | |
| 2009/0114818 A1 | 5/2009 | Casares et al. | |
| 2009/0159810 A1 | 6/2009 | Knippelmeyer et al. | |
| 2009/0256075 A1 | 10/2009 | Kemen et al. | |
| 2010/0276606 A1 | 11/2010 | Baars | |
| 2011/0188017 A1 | 8/2011 | Horn et al. | |
| 2014/0197325 A1* | 7/2014 | Kato | H01J 37/3177 |
| | | | 250/396 R |
| 2015/0069235 A1 | 3/2015 | Kemen et al. | |
| 2015/0083911 A1 | 3/2015 | Zeidler et al. | |
| 2015/0155138 A1 | 6/2015 | Yoshikawa et al. | |
| 2015/0213998 A1 | 7/2015 | Winkler | |
| 2015/0348738 A1 | 12/2015 | Zeidler et al. | |
| 2015/0357157 A1 | 12/2015 | Mueller et al. | |
| 2016/0268096 A1 | 9/2016 | Ren et al. | |
| 2016/0322196 A1 | 11/2016 | Hasegawa | |
| 2017/0133194 A1 | 5/2017 | Zeidler et al. | |
| 2017/0133198 A1 | 5/2017 | Kruit | |
| 2017/0316912 A1 | 11/2017 | Zeidler et al. | |
| 2018/0068825 A1 | 3/2018 | Brodie | |
| 2019/0035603 A1 | 1/2019 | Iizuka | |
| 2019/0066972 A1 | 2/2019 | Frosien | |
| 2019/0259575 A1 | 8/2019 | Sarov et al. | |
| 2019/0333732 A1 | 10/2019 | Ren | |
| 2020/0211810 A1 | 7/2020 | Zeidler | |
| 2020/0243300 A1 | 7/2020 | Zeidler | |
| 2020/0373116 A1 | 11/2020 | Zeidler | |
| 2021/0005423 A1 | 1/2021 | Zeidler | |
| 2021/0035773 A1 | 2/2021 | Zeidler | |

FOREIGN PATENT DOCUMENTS

| | | |
|---|---|---|
| DE | 10 2013 016 113 A1 | 3/2015 |
| DE | 10 2014 224 607 A1 | 6/2015 |
| DE | 10 2014 008 083 A1 | 12/2015 |
| DE | 10 2017 210 636 A1 | 8/2017 |
| DE | 10 2016 217 285 A1 | 3/2018 |
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 2001-118491 A | 4/2001 |
| JP | 2014229481 A | 12/2014 |

(56) References Cited

FOREIGN PATENT DOCUMENTS

| | | |
|---|---|---|
| WO | WO 01/39243 A1 | 5/2001 |
| WO | WO 2005/024881 A2 | 3/2005 |
| WO | WO 2007/028595 A2 | 3/2007 |
| WO | WO 2007/028596 A1 | 3/2007 |
| WO | WO 2007/060017 A2 | 5/2007 |
| WO | WO 2010/040506 A1 | 4/2010 |
| WO | WO2013032949 A1 | 3/2013 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

\* cited by examiner

MULTI-BEAM PARTICLE BEAM SYSTEM

CROSS REFERENCE TO RELATED APPLICATION

The present application is a continuation of, and claims benefit under 35 USC 120 to, U.S. application Ser. No. 16/277,572, filed Feb. 15, 2019, now U.S. Pat. No. 10,854,423, which claims benefit under 35 USC 119 of German Application No. 10 2018 202 421.9, filed Feb. 16, 2018. The entire disclosure of these applications are incorporated by reference herein.

FIELD

The disclosure relates to multi-beam particle beam systems which operate with a multiplicity of particle beams.

BACKGROUND

US 2015/0348738 A1 discloses multi-beam particle beam systems which use a plurality of multi-aperture plates to split a particle beam into a multiplicity of particle beams and to influence individual particle beams of the multiplicity of particle beams by providing electric fields. By way of example, at individual apertures of a multi-aperture plate ring electrodes are used to provide focusing electrostatic fields, and electrodes arranged in a manner distributed around apertures of the multi-aperture plate in the circumferential direction provide dipole fields or quadrupole fields in order to provide the effect of beam deflectors or stigmators.

61 particle beams are used in the multi-beam particle beam system known from US 2015/0348738 A1. Increasing the number of particle beams involves supplying desired voltages to the many electrodes arranged at the then further increased number of apertures.

SUMMARY

The disclosure proposes multi-beam particle beam systems including multi-aperture plates and methods for producing multi-aperture plates which make it possible to feed settable electrical voltages to electrodes at a larger multiplicity of apertures in the multi-aperture plates.

In accordance with exemplary embodiments, a multi-beam particle beam system includes a particle source for generating a particle beam. The particle source can be an electron source. The multi-beam particle beam system furthermore includes a first multi-aperture plate for splitting the particle beam generated by the particle source into a multiplicity of particle beams, and at least one particle-optical lens to focus the multiplicity of particle beams in each case in an object plane. The at least one particle-optical lens can generate an electric and/or magnetic focusing field for all the particle beams, wherein all the particle beams pass through this focusing field.

The multi-beam particle beam system furthermore includes a second multi-aperture plate, having a multiplicity of apertures, wherein through each of the apertures there passes one particle beam of the multiplicity of particle beams during the operation. The second multi-aperture plate is arranged in the beam path downstream of the first multi-aperture plate.

The multi-beam particle beam system furthermore includes a multiplicity of electrodes, wherein at each of the multiplicity of apertures of the second multi-aperture plate at least one of the multiplicity of electrodes is arranged in order to influence the particle beam passing through the aperture. The electrodes are arranged in a manner insulated from the second multi-aperture plate, such that two different electrodes from among the electrodes can be at mutually different electrical potentials and between the latter there flows only a small current corresponding to the resistance of the insulation. It is desirable for currents between different electrodes at the second multi-aperture plate to be low since they thermally load the second multi-aperture plate situated in vacuo.

The multi-beam particle beam system furthermore includes a voltage supply system, in order to feed a respective settable predetermined voltage to each of the multiplicity of electrodes. The predetermined voltage can be determined by the desired manner of influencing the particle beam passing through the aperture at which the electrode is arranged. By way of example, if a plurality of electrodes arranged in a manner distributed around an aperture are intended to act on the particle beam passing through the aperture as a stigmator, then electrical potentials are fed to the electrodes such that voltage differences of between 0 V and 20 V, for example, arise between pairs of electrodes which are not situated opposite one another at the aperture. If an electrode provided at the aperture is intended to act on the particle beam passing through the aperture as a focusing lens, then electrical voltages can be fed to the electrode such that the electrode is for example up to 100 V or 200 V above or below the potential of the second multi-aperture plate.

In accordance with exemplary embodiments, the multi-beam particle beam system includes at least one signal generator configured to generate a serial sequence of digital signals. The digital signals represent electrical voltages which are to be fed to some electrodes of the multiplicity of electrodes. The voltage supply system furthermore includes at least one D/A converter, which converts the digital signals generated by the signal generator into a sequence of voltages between an output of the D/A converter and the second multi-aperture plate. The voltages to be fed to the aforesaid some electrodes are thus generated by the D/A converter temporally successively at an output. In this case, the D/A converter can include a component that converts the digital signal into an analogue voltage signal having a maximum value. The analogue voltage signal can be fed directly to the output. If it is desirable for an analogue voltage signal having a larger maximum value to be fed to the output, the D/A converter can additionally include a component for voltage amplification that converts the analogue voltage having the maximum value into an analogue voltage having a larger maximum value, which is then fed to the output of the D/A converter.

The voltage supply system includes a controllable changeover system configured to feed the sequence of voltages at the output of the D/A converter successively to different electrodes of the aforesaid some electrodes. Consequently, the aforesaid some electrodes are successively fed the voltages respectively provided for these electrodes. These voltages are predefined by the signal generator that generates the serial sequence of digital signals. The generation of the serial sequence of digital signals is carried out in a manner synchronized with the operation of the controllable changeover system in such a way that the changeover system feeds each analogue voltage represented by a respective digital signal of the serial sequence of digital signals to that electrode for which the voltage is intended. The signal generator can generate the serial sequence of digital signals in a temporally repeating manner, such that the aforesaid some electrodes are fed respectively the same voltage anew again and again in a temporally recurring manner.

In this case, a capacitance between each of the electrodes and the second multi-aperture plate, a resistance between each of the electrodes and the second multi-aperture plate and a changeover frequency of the changeover system can each have a magnitude such that the voltages at each of the electrodes with respect to the second multi-aperture plate on average over time correspond to the predetermined voltage for the respective electrode. As a result of the operation of the changeover system, the voltage from the output of the D/A converter is fed to each electrode in each case only for a short time, whereupon the changeover system then isolates the respective electrode from the output of the D/A converter. The electrode insulated from the second multi-aperture plate continuously discharges during this time. The discharge current is determined by the resistance between the electrode and the second multi-aperture plate. The electrical charge available for the discharge of the electrode is determined by the capacitance between the electrode and the second multi-aperture plate. The capacitance and the resistance between the respective electrode and the second multi-aperture plate thus determine the discharge time constant for the discharge of the electrode. The changeover frequency of the changeover system thus determines the ratio between the maximum value and the minimum value of the voltage at the respective electrode. Consequently, the voltage fed to the electrode from the D/A converter can be chosen such that the voltage of the electrode on average over time corresponds to the predetermined voltage and the maximum deviations of the voltage of the electrode from the predetermined voltage for a given application are sufficiently small and are for example less than 10% or less than 5% or less then 1% of the predetermined voltage.

This configuration makes it possible to provide a voltage supply system in which the number of D/A converters and, if appropriate, of components for voltage amplification is less than the number of electrodes to be supplied with predetermined settable voltages. This can have the effect that it becomes possible to arrange the D/A converters and, if appropriate, the components for voltage amplification near the apertures of the second multi-aperture plate or between apertures of the second multi-aperture plate. In comparison with the case in which a dedicated D/A converter and, if appropriate, components for voltage amplification are assigned to each electrode, the reduced number of D/A converters and, if appropriate, components for voltage amplification leads to a lower current consumption of the voltage supply system and thus to a lower thermal loading of the second multi-aperture plate.

In accordance with exemplary embodiments, the voltage supply system furthermore includes a multiplicity of capacitors, wherein each of the capacitors is connected to one of the electrodes on one side and to the second multi-aperture plate on the other side. These additional capacitors increase the capacitance between the respective electrode and the second multi-aperture plate, such that the discharge time constant of the respective electrode is increased.

It is possible for a single D/A converter to be provided for supplying all the electrodes. On the other hand, it is also possible for a plurality of D/A converters to be provided, wherein each of the plurality of D/A converters supplies a subset of the multiplicity of electrodes.

In accordance with exemplary embodiments, the changeover system includes a matrix composed of a multiplicity of switches, each of which is connected to one of a plurality of column lines, to one of a plurality of row lines and to the output of the D/A converter and is configured to connect the output of the D/A converter to the electrode only if a level of the column line and a level of the row line to which the respective switch is connected have a predetermined value; and wherein the voltage supply system includes an addressing circuit configured to set the levels of the plurality of column lines and the levels of the plurality of row lines in accordance with the serial sequence of digital signals.

In accordance with exemplary embodiments, the at least one D/A converter is mounted on the second multi-aperture plate, and the voltage supply system includes a voltage source configured to generate a potential difference between the first multi-aperture plate and the second multi-aperture plate. In cases in which the voltages to be fed to the electrodes are large in comparison with a voltage at the first multi-aperture plate, the maximum values of the voltages which are to be generated by the D/A converters on the second multi-aperture plate can be reduced as a result. This leads to a lower thermal loading at the second multi-aperture plate.

In accordance with further exemplary embodiments, the voltage supply system includes a signal generator for generating a digital signal, and a high-voltage source configured to generate at least one first and one second high voltage with respect to the second multi-aperture plate, wherein the second high voltage is greater than the first high voltage. The voltage supply system furthermore includes a D/A converter, which converts the digital signal generated by the signal generator into an analogue voltage difference having a first maximum value. As explained above, the D/A converter can include a component for voltage amplification in order to generate the analogue voltage difference having the first maximum value.

The voltage supply system furthermore includes two driver stages, wherein the first high voltage is fed to the first driver stage as an operating voltage and the second high voltage is fed to the second driver stage as an operating voltage.

The first driver stage is configured to amplify the analogue voltage difference output by the D/A converter into a voltage between the second multi-aperture plate and a first output of the first driver stage, wherein the voltage at the first output with respect to the second multi-aperture plate is less than the first high voltage. The second driver stage is configured to amplify the analogue voltage difference output by the D/A converter into a voltage between the second multi-aperture plate and a second output of the second driver stage, wherein the voltage at the second output with respect to the second multi-aperture plate is less than the second high voltage, but in this case can indeed be greater than the first high voltage depending on the magnitude of the instantaneous analogue voltage difference.

The voltage supply system furthermore includes a changeover switch configured optionally to connect at least one of the electrodes either to the first output or to the second output.

As a result, it is possible to provide a plurality of driver stages, which operate with different operating voltages, for supplying the electrodes with voltages. Depending on the magnitude of the settable predetermined voltage which is to be fed to a given electrode, it is possible to select the driver stage having the smallest operating voltage which is able to output the voltage predetermined for the electrode. It is then not necessary to use a driver stage for supplying the electrode which draws a very much larger operating voltage in comparison with the predetermined voltage to be fed to the electrode and, on account of the magnitude ratio between operating voltage and voltage output, generates a comparatively high power loss and contributes to the thermal loading of the first multi-aperture plate if the driver stage is mounted on the first multi-aperture plate.

In accordance with exemplary embodiments, at least some apertures of the first multi-aperture plate, at least eight electrodes of the multiplicity of electrodes are arranged in a manner distributed around the respective aperture in the circumferential direction and insulated from the second multi-aperture plate in order to influence the particle beam passing through the aperture. The voltage supply system for feeding settable predetermined voltages to the electrodes can then be configured to guide the at least eight electrodes arranged around an aperture such that they act on the particle beam passing through the aperture as a stigmator by virtue of the electrodes being fed voltages which generate potential differences between electrodes which are not situated opposite one another in relation to the aperture. The voltage supply system is furthermore configured to drive the at least eight electrodes arranged around an aperture such that they act on the particle beam passing through the aperture as a lens by virtue of the electrodes being fed voltages which generate a potential difference between the second multi-aperture plate and an average potential of the at least eight electrodes. In this case, the average potential corresponds to the mean value of the potentials of the at least eight electrodes that are arranged around the aperture. The mean value can be for example the arithmetic mean value of the potentials of the at least eight electrodes. The at least eight electrodes need not all be at the same or average potential since, after all, they can provide for example an additional effect, such as that of the stigmator.

In accordance with exemplary embodiments, a maximum value of the potential difference between the second multi-aperture plate and the average potential of the at least eight electrodes is at least ten times greater than a maximum value of the potential differences between pairs of the at least eight electrodes arranged in a manner distributed around the aperture. It is thus possible to provide significantly larger voltages for providing the lens effect than for generating the stigmator effect.

According to exemplary embodiments, the eight electrodes of the second multi-aperture plate can be used to compensate an undesired beam displacement. For example, if the apertures of the second multi-aperture plate and the apertures of the first multi-aperture plate and/or the third multi-aperture plate are not perfectly aligned with each other due to manufacturing inaccuracies, e.g., an application of voltages to the electrodes of the second multi-aperture plate generates, apart from a focusing field, a dipole field resulting in a deflection of the beam traversing the respective apertures. This deflection further results in a beam displacement in the object plane of the system, affecting the relative positions of the images generated by the individual beams. Such undesired beam displacements can be compensated by a suitable application of voltages to the eight electrodes of the second multi-aperture plate.

In accordance with exemplary embodiments the voltage supply system includes a plurality of D/A converters, the output voltages of which are fed to the at least eight electrodes. In this case, the number of D/A converters can be equal to the number of the at least eight electrodes. However, it is also possible for the number of D/A converters to be less than the number of the at least eight electrodes and for the output voltage of at least one of the D/A converters to be fed to a plurality of electrodes. In this case, the voltage supply system can include at least one second D/A converter, the output voltage of which is fed to the plurality of first D/A converters as an operating voltage. As a result, it is possible, in a simple manner and with unnecessary losses being avoided, to generate the comparatively large voltages for generating the lens effect with the second D/A converter and to generate the comparatively smaller voltages for generating the stigmator effect with the plurality of first D/A converters.

BRIEF DESCRIPTION OF THE DRAWINGS

Embodiments of the disclosure are explained in greater detail below with reference to figures, in which.

DESCRIPTION OF EXEMPLARY EMBODIMENTS

Figure 1:
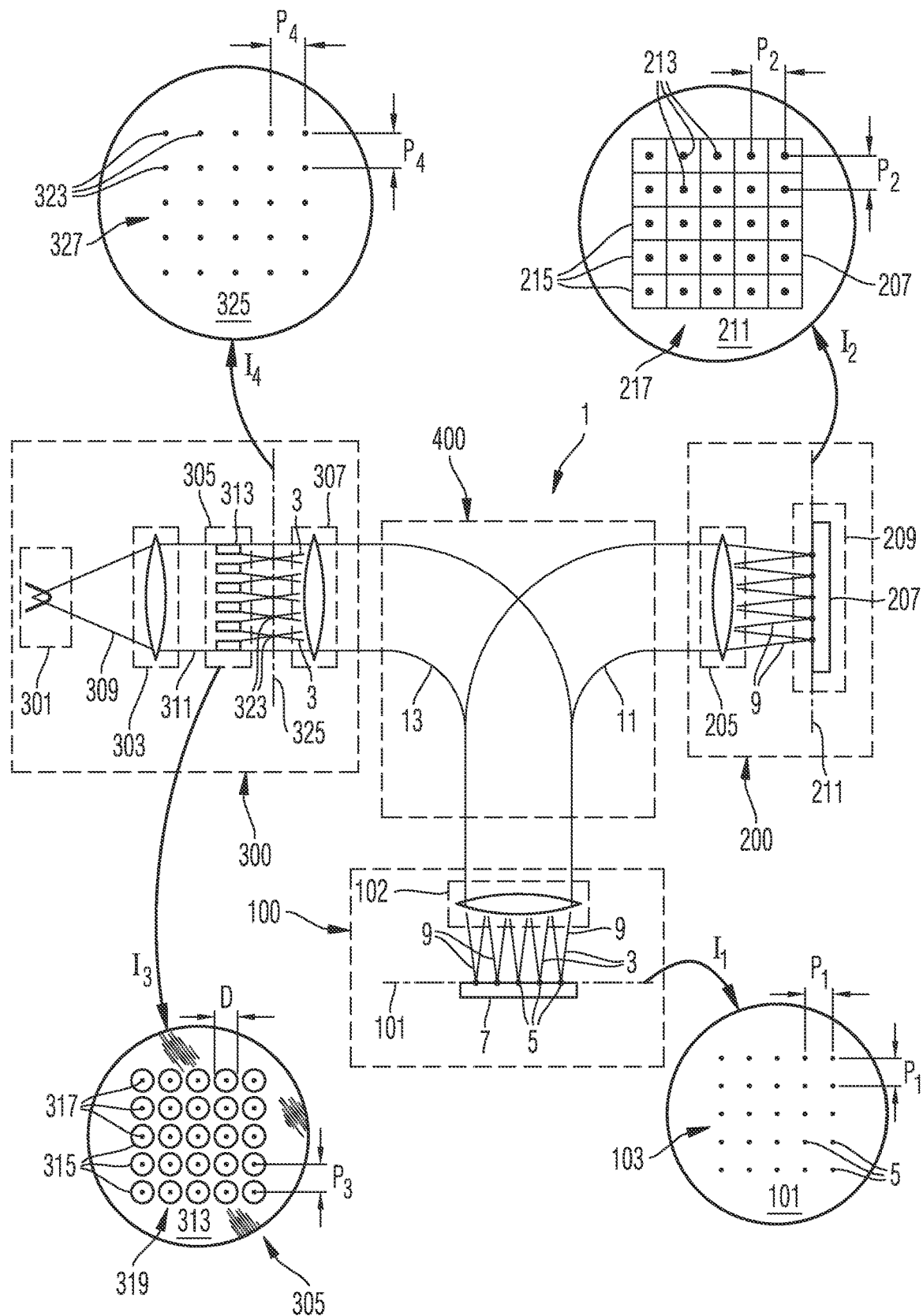
FIG. 1 shows a schematic illustration of a multi-beam particle beam system.

FIG. 1 is a schematic illustration of a multi-beam particle beam system 1, which uses a multiplicity of particle beams. The multi-beam particle beam system 1 generates a multiplicity of particle beams which impinge on an object to be examined in order to generate there electrons which emanate from the object and are subsequently detected. The multi-beam particle beam system 1 is of the scanning electron microscope (SEM) type, which uses a plurality of primary electron beams 3 which impinge at locations 5 on a surface of the object 7 and generate a plurality of electron beam spots there. The object 7 to be examined can be of any desired type and include for example a semiconductor wafer, a biological sample, and an arrangement of miniaturized elements or the like. The surface of the object 7 is arranged in an object plane 101 of an objective lens 102 of an objective lens system 100.

The enlarged excerpt I1 in FIG. 1 shows a plan view of the object plane 101 having a regular rectangular field 103 of impingement locations 5 formed in the plane 101. In FIG. 1, the number of impingement locations is 25, which form a 5×5 field 103. The number 25 of impingement locations is a small number chosen for reasons of simplified illustration. In practice, the number of beams or impingement locations can be chosen to be significantly greater, such as, for example, 20×30, 100×100 and the like.

In the embodiment illustrated, the field 103 of impingement locations 5 is a substantially regular rectangular field having a constant distance P1 between adjacent impingement locations. Exemplary values of the distance P1 are 1 micrometre, 10 micrometres and 40 micrometres. However, it is also possible for the field 103 to have other symmetries, such as a hexagonal symmetry, for example.

A diameter of the beam spots formed in the object plane 101 can be small. Exemplary values of the diameter are 1 nanometre, 5 nanometres, 100 nanometres and 200 nanometres. The focusing of the particle beams 3 for forming the beam spots 5 is carried out by the objective lens system 100.

The particles impinging on the object generate electrons that emanate from the surface of the object 7. The electrons emanating from the surface of the object 7 are shaped by the objective lens 102 to form electron beams 9. The inspection system 1 provides an electron beam path 11 in order to feed the multiplicity of electron beams 9 to a detection system 200. The detection system 200 includes an electron optical unit having a projection lens 205 to direct the electron beams 9 onto an electron multi-detector 209.

The excerpt I2 in FIG. 1 shows a plan view of a plane 211, in which lie individual detection regions on which the electron beams 9 impinge at locations 213. The impingement locations 213 lie in a field 217 with a regular distance P2 with respect to one another. Exemplary values of the distance P2 are 10 micrometres, 100 micrometres and 200 micrometres.

The primary electron beams 3 are generated in a beam generating device 300 including at least one electron source 301, at least one collimation lens 303, a multi-aperture arrangement 305 and a field lens 307. The electron source 301 generates a diverging electron beam 309, which is collimated by the collimation lens 303 to form a beam 311 which illuminates the multi-aperture arrangement 305.

The excerpt 13 in FIG. 1 shows a plan view of the multi-aperture arrangement 305. The multi-aperture arrangement 305 includes a multi-aperture plate 313 having a plurality of openings or apertures 315 formed therein. Midpoints 317 of the openings 315 are arranged in a field 319 corresponding to the field 103 formed by the beam spots 5 in the object plane 101. A distance P3 between the midpoints 317 of the apertures 315 can have exemplary values of 5 micrometres, 100 micrometres and 200 micrometres. The diameters D of the apertures 315 are smaller than the distance P3 between the midpoints of the apertures. Examples of values of the diameters D are 0.2× P3, 0.4×P3 and 0.8×P3.

Electrons of the illuminating beam 311 pass through the apertures 315 and form electron beams 3. Electrons of the illuminating beam 311 which impinge on the plate 313 are absorbed by the latter and do not contribute to the formation of the electron beams 3.

On account of an applied electrostatic field, the multi-aperture arrangement 305 focuses the electron beams 3 in such a way that the foci 323 are formed in a plane 325. A diameter of the foci 323 can be for example 10 nanometres, 100 nanometres and 1 micrometre.

The field lens 307 and the objective lens 102 provide a first imaging particle optical unit for imaging the plane 325 in which the foci are formed onto the object plane 101, such that a field 103 of impingement locations 5 or beam spots is formed there on the surface of the object 7.

The objective lens 102 and the projection lens arrangement 205 provide a second imaging particle optical unit for imaging the object plane 101 onto the detection plane 211. The objective lens 102 is thus a lens which is part of both the first and the second particle optical unit, while the field lens 307 belongs only to the first particle optical unit and the projection lens 205 belongs only to the second particle optical unit.

A beam switch 400 is arranged in the beam path of the first particle optical unit between the multi-aperture arrangement 305 and the objective lens system 100. The beam switch 400 is also part of the second particle optical unit in the beam path between the objective lens system 100 and the detection system 200.

Further information concerning such multi-beam particle beam systems and components used therein, such as, for instance, particle sources, multi-aperture plates and lenses, can be obtained from the international patent applications WO 2005/024881, WO 2007/028595, WO 2007/028596 and WO 2007/060017, and the German patent applications having the application numbers US 2015/0083911 A1, US 2015/0069235 A1 and US 2015/0348738 A1, the disclosure of which in the full scope thereof is incorporated by reference in the present application.

Figure 9:
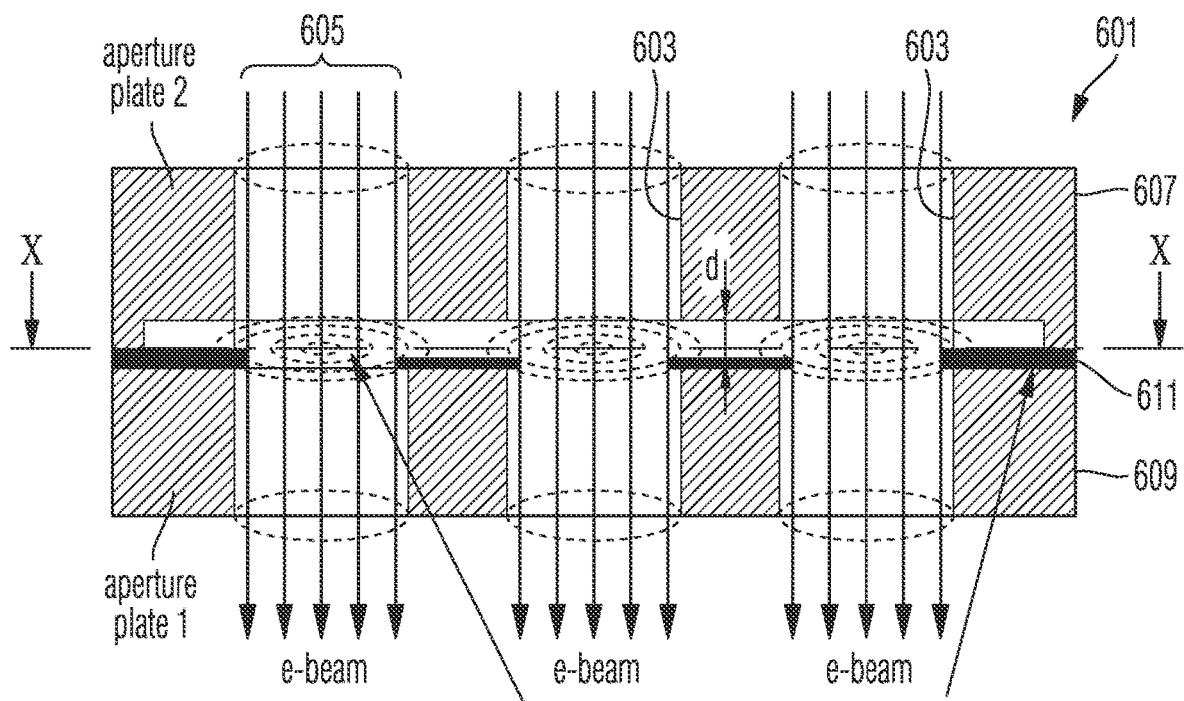
FIG. 9 shows a schematic illustration of a multi-aperture plate with electrodes within the openings.

FIG. 9 of US 2015/0348738 A1 shows an arrangement including three multi-aperture plates for shaping, focusing and correctively influencing the multiplicity of particle beams. Of the three multi-aperture plates arranged one behind another in the beam path, the first serves to split a particle beam generated by a particle source into a multiplicity of individual particle beams, the second multi-aperture plate serves to provide a stigmator for each particle beam of the multiplicity of particle beams, for which purpose eight electrodes are arranged at each aperture of the multi-aperture plate in a manner distributed around the latter in the circumferential direction. The apertures of the third multi-aperture plate act on the particle beams passing through the apertures as focusing lenses and are intended to focus the particle beams in an intermediate plane that is imaged onto the object by further lenses of the multi-beam particle beam system.

Figure 2:
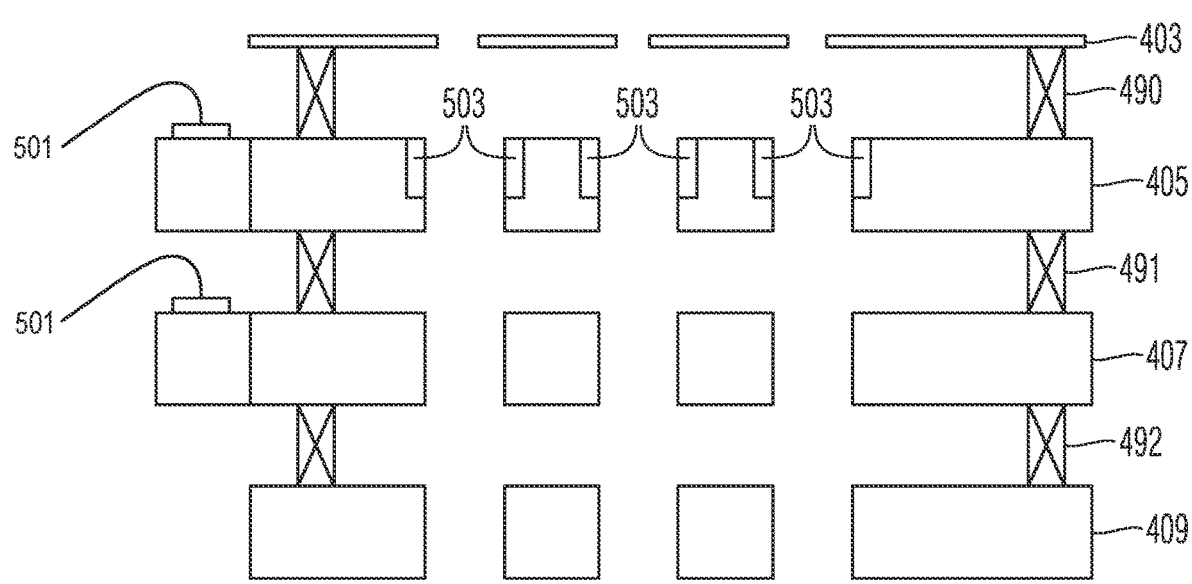
FIG. 2 shows a schematic cross-sectional illustration of an arrangement composed of a plurality of multi-aperture plates.

It has been found that not all of the particle beams are focused in the intermediate plane. This may be owing to manufacturing-dictated tolerances, inter alia. In order to enable the focusing of the individual particle beams in better proximity to the intermediate plane, the arrangement 401 composed of a plurality of multi-aperture plates as shown in FIG. 2 includes four multi-aperture plates. A first multi-aperture plate 403 serves to split a particle beam impinging on it into a multiplicity of particle beams that pass through the apertures in the first multi-aperture plate 403. A second multi-aperture plate 405 is arranged in the beam path downstream of the first multi-aperture plate 403, wherein ring electrodes are fitted to the inner walls of the apertures of the second multi-aperture plate 405, which ring electrodes can be connected to settable electrical potentials by a voltage supply system in order to have a settable focusing effect on the particle beam passing through the respective aperture.

A first spacer 490 can be arranged between the first multi-aperture plate 403 and the second multi-aperture plate 405. A second spacer 491 can be arranged between the second multi-aperture plate 405 and the third multi-aperture plate 407. A third spacer 492 can be arranged between the third multi-aperture plate 407 and the fourth multi-aperture plate 409. The thicknesses of the three spacers 491, 492, 493 can be identical or different from one another, as desired, and can be between a few nanometres and a few millimetres. In particular, individual spacers, such as the second spacer 492, for example, can also consist only of an electrically insulating oxide layer having a thickness of a few nanometres, while other spacers, such as the first spacer 490 and/or the third spacer 492, for example, can have a thickness in a range of between a few micrometres and a few millimetres.

A third multi-aperture plate 407 arranged in the beam path downstream of the second multi-aperture plate 405 has apertures which are respectively assigned to eight electrodes which are arranged around the aperture in the circumferential direction and can be connected to settable potentials by the voltage supply system. The eight electrodes make it possible to generate quadrupole fields of settable orientation and strength, which act on the beams passing through the apertures as a stigmator.

A fourth multi-aperture plate 409 arranged downstream of the third multi-aperture plate 407 in the beam path has apertures which, on account of the electric fields adjoining the fourth multi-aperture plate 409, respectively have a focusing effect on the beams passing through the apertures, in order to focus the beams in the intermediate plane that is imaged onto the object.

The first, third and fourth multi-aperture plates can have a configuration and a construction as described in US 2015/0348738 A1. The additional second multi-aperture plate 405 can be produced for example by the production method described below.

The electrodes at the third multi-aperture plate 407 are supplied with voltages by the voltage supply system in such a way that an astigmatism possibly present in the particle beam passing through the aperture is compensated for by the effect of the eight electrodes at each aperture as a stigmator.

The ring electrodes at the apertures of the second multi-aperture plate 405 are supplied with voltages by the voltage supply system in such a way that the focusing effect provided by the ring electrodes together with the focusing effect of the apertures of the fourth multi-aperture plate 409 brings about the focusing of the individual particle beams as near as possible to the intermediate plane 325 (see FIG. 1).

A possible production method for the second multi-aperture plate 405 is explained below with reference to FIGS. 3A to 3O.

Figure 3A:
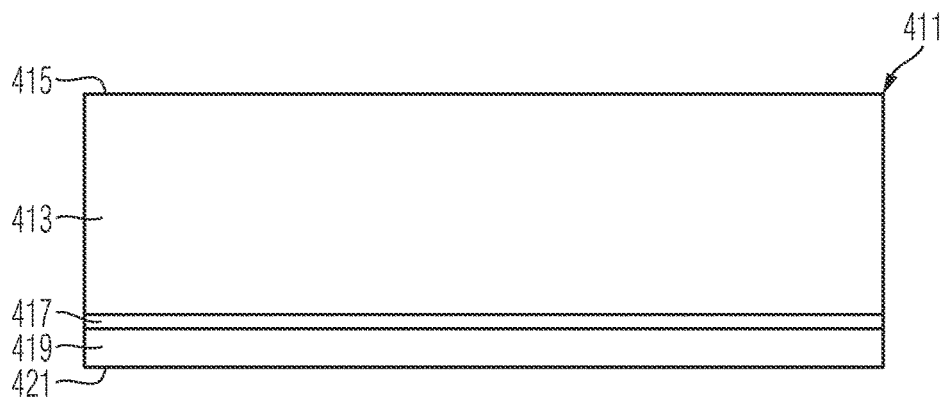
FIGS. 3A to 3O show various cross-sectional views of a substrate of a multi-aperture plate in a plurality of stages during a method for producing the multi-aperture plate.

In order to produce the second multi-aperture plate 405, firstly a plate 411 is provided, which is shown in cross section in FIG. 3A. The plate 411 is formed from a silicon-on-insulator wafer (SOI wafer) having an upper silicon layer 413 in the figure, which provides an upper surface 415 of the plate 411, an insulator layer 417 and a lower silicon layer 419, which provides a lower surface 421 of the plate 411. The upper layer 413 has a thickness of 200 µm to 300 µm, for example. This thickness corresponds to the height of the ring electrodes to be fabricated. The lower layer 419 serves as a carrier and can have a significantly larger thickness than the upper layer 413.

Figure 3B:
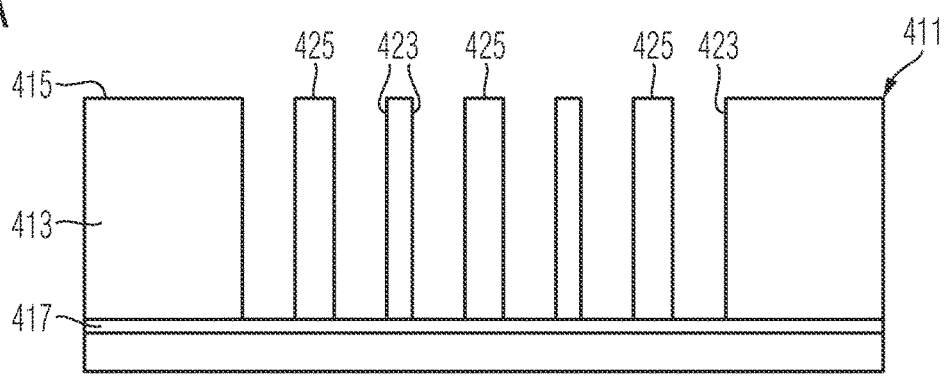

Deep reactive ion etching (DRIE) is then used to introduce into the plate 411 blind holes 423 each having the shape of a cylindrical ring, wherein each cylindrical ring surrounds a remaining core 425 composed of the material of the upper layer 413. With regard to their depth, the blind holes 423 are delimited by the insulator layer 417, which serves as an etch stop layer during the etching of the blind holes 423 (see FIG. 3B).

Figure 3C:
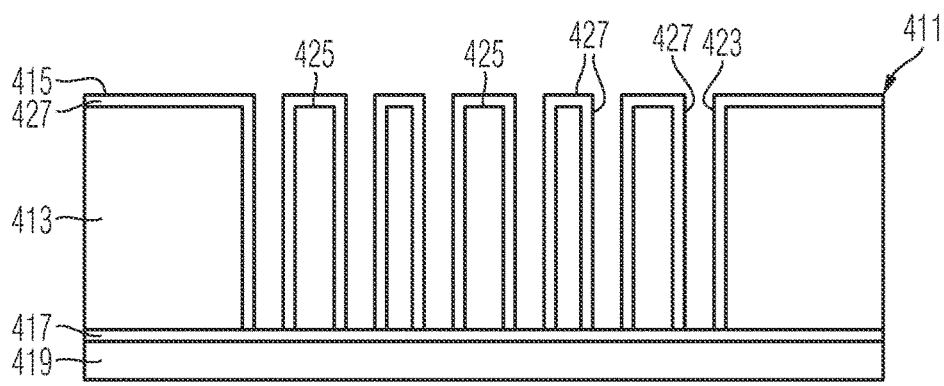

In a subsequent step, the inner surfaces of the blind holes 423 and the top side 415 of the upper layer 413 are provided with an insulation layer 427 by virtue of the silicon of the silicon layer 413 being oxidized by thermal oxidation to form SiO₂ (see FIG. 3C).

Figure 3D:
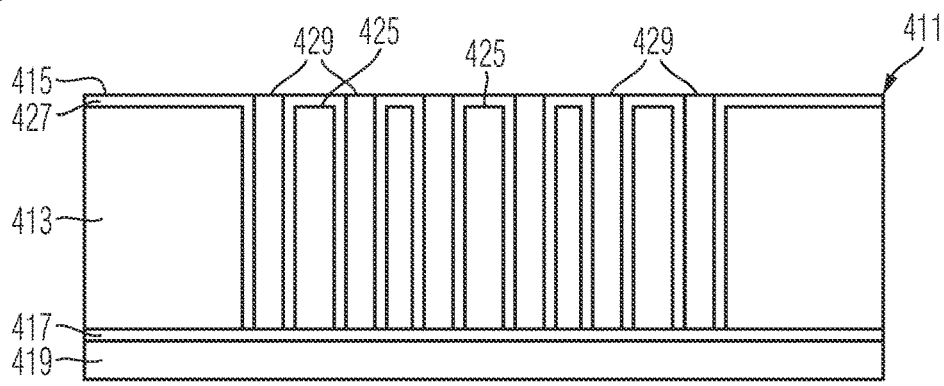

Afterwards, the blind holes 423 each having the shape of a cylindrical ring are filled with conductive material 429 (see FIG. 3D). The conductive material can be highly doped polysilicon or other conductive material.

Figure 3E:
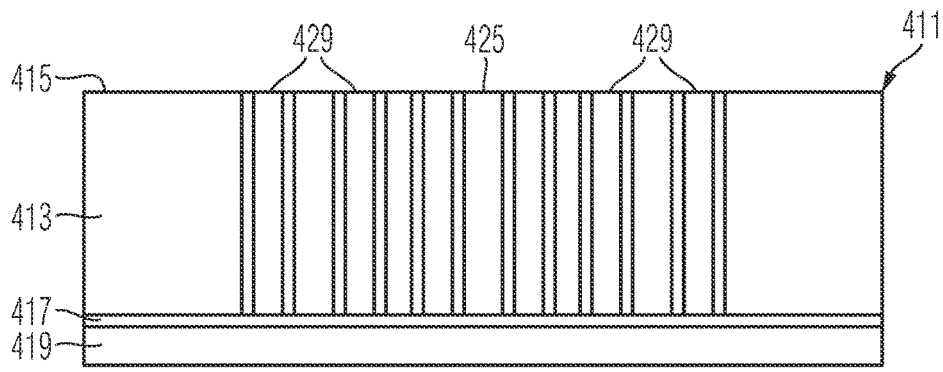

In a subsequent step, the upper side 415 of the plate 411 is polished in order to remove the insulation layer 427 and to smooth the upper side 415 (see FIG. 3E).

Figure 3F:
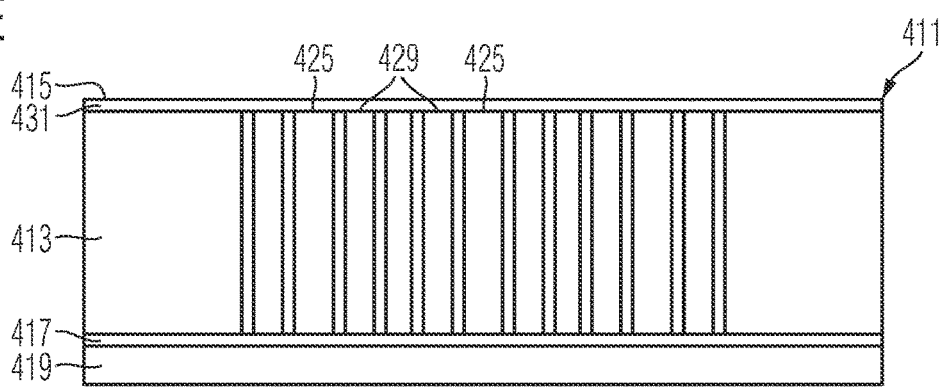

Afterwards, the upper side 415 of the plate 411 is provided with an insulation layer 431 throughout by virtue of SiO₂, for example, being deposited there (see FIG. 3F).

Figure 3G:
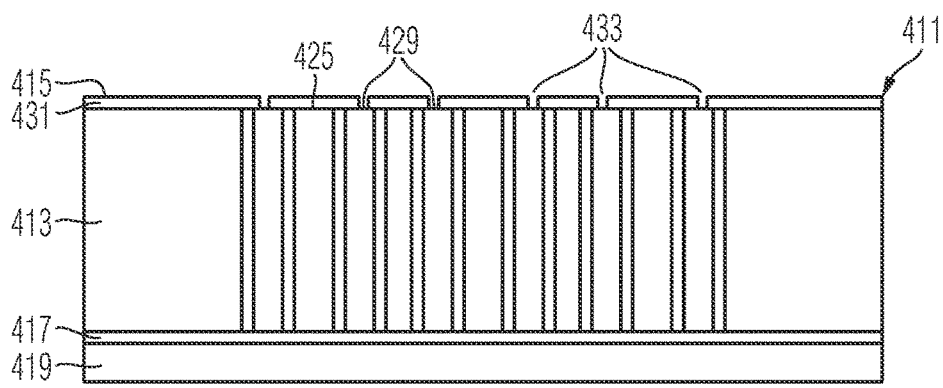
Figure 3H:
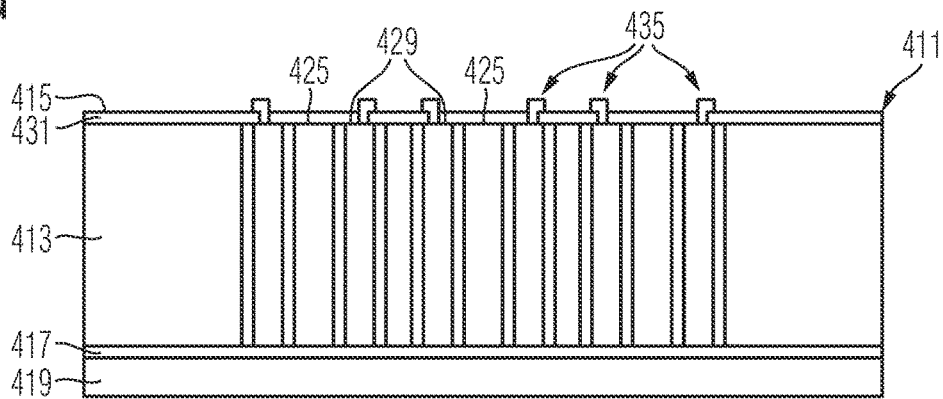

In a subsequent step, openings 433 are introduced into the insulation layer 431 for example via reactive ion etching (see FIG. 3G), which openings are subsequently filled with metal 435 (see FIG. 3H) in order to electrically contact the conductive material 429 with which the blind holes having the shape of the cylindrical ring were filled. During this work operation, conductor tracks 437 (see FIG. 3I) can also be applied on the surface 415 of the plate 411, the conductor tracks leading to the metal contacts 435, such that the ring cylinders composed of conductive material 429 can be supplied with voltages later via the conductor tracks 437.

Figure 3I:
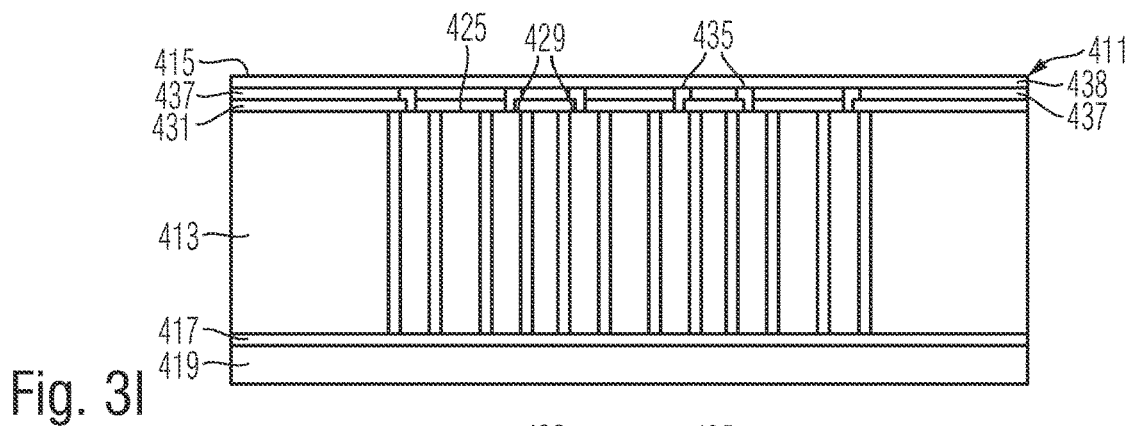

Afterwards, the upper surface 415 of the plate 411 is covered with a passivation layer 438, for example composed of SiO₂, whereby the conductor tracks 437 formed previously are also covered and electrically insulated (see FIG. 3I).

Figure 3J:
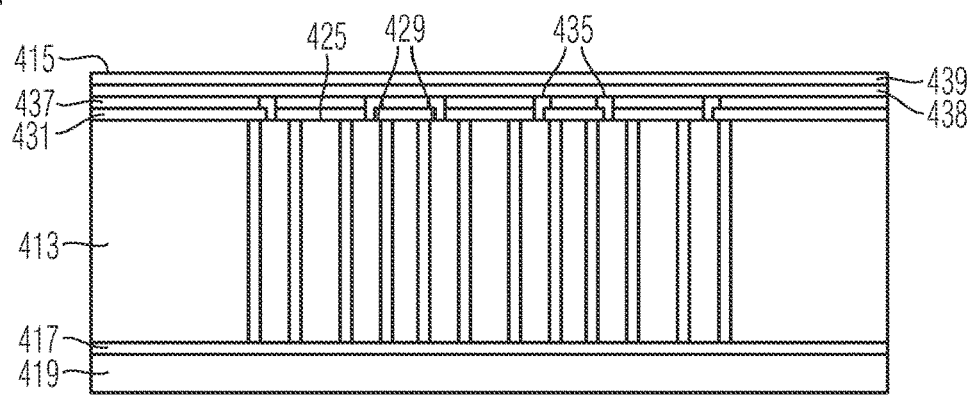

Afterwards, a layer 439 composed of metal is applied to the surface 415 of the plate 411 (see FIG. 3J).

Figure 3K:
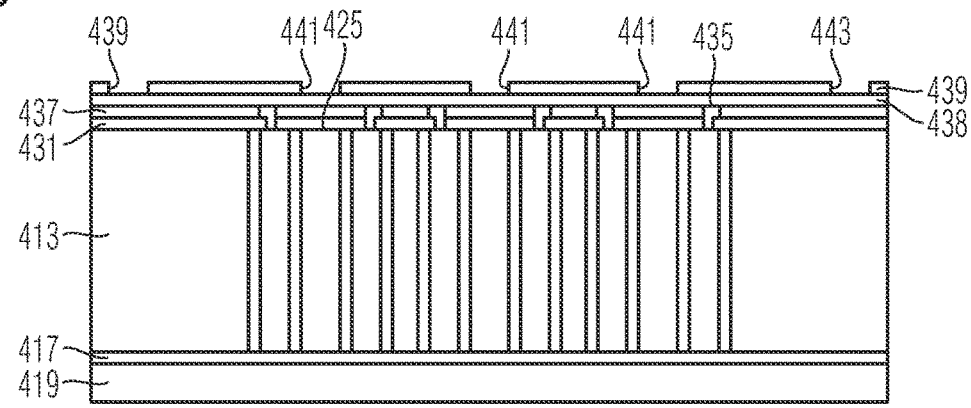

Afterwards, openings 441 are formed in the metal layer 439 at locations arranged above the cores 425 of the blind holes that remained previously. Furthermore, openings 443 are formed in the metal layer 439, the openings serving for the later contacting of the conductor tracks 437. The openings 441 and 443 can be produced by etching after a suitable mask has been applied to the metal layer 439 in a preceding lithography step (see FIG. 3K).

Figure 3L:
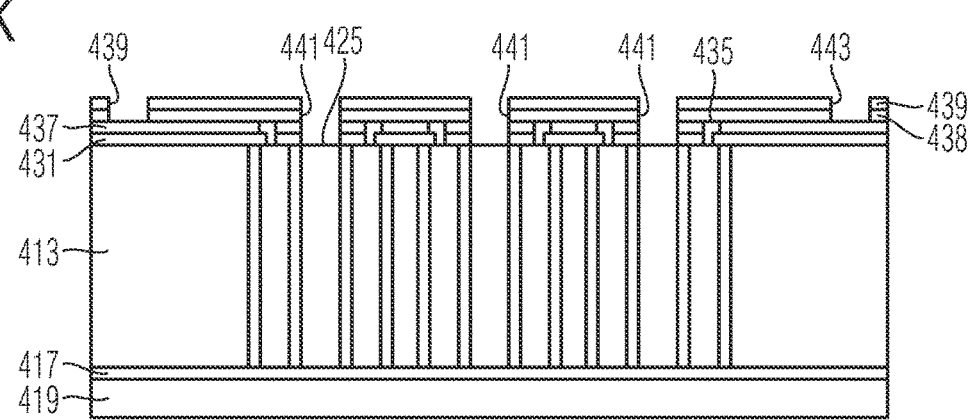

Afterwards, the holes 441 and 443, which up until then are formed only in the metal layer 439, are deepened by reactive ion etching, for example, into the underlying insulation layer 438 until, in the case of the holes 443, the metal of the conductor tracks 437 serves as an etch stop, while the holes 441 are deepened further into the insulation layer 431 until the silicon of the material of the plate 413 serves as an etch stop (see FIG. 3L).

Afterwards, the residual cores 425 are removed through the openings 441, with the result that blind holes 445 are formed in the plate 411. The material of the cores 425 can be removed for example by plasma etching (using SF6 plasma or XIF2 gas). In this case, the insulator layer 417 serves as an etch stop in the depth direction of the holes 445, and the insulation layer 427 serves as an etch stop in the circumferential direction around the holes 445 (see FIG. 3M).

Figure 3M:
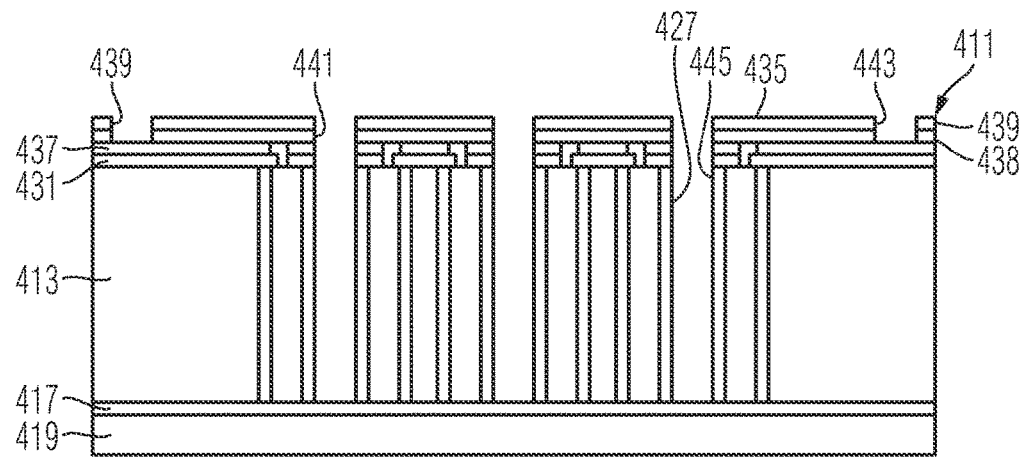
Figure 3N:
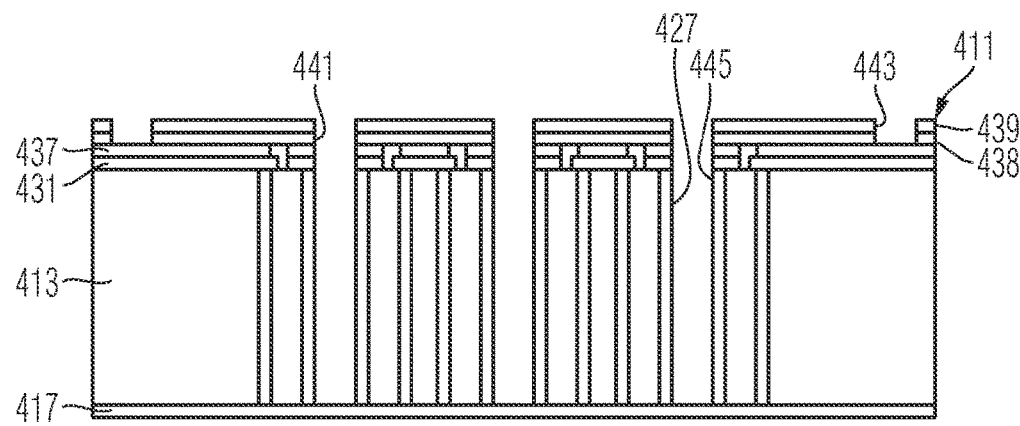

Afterwards, the lower silicon layer 419 is removed for example by grinding or etching (see FIG. 3M).

Figure 3O:
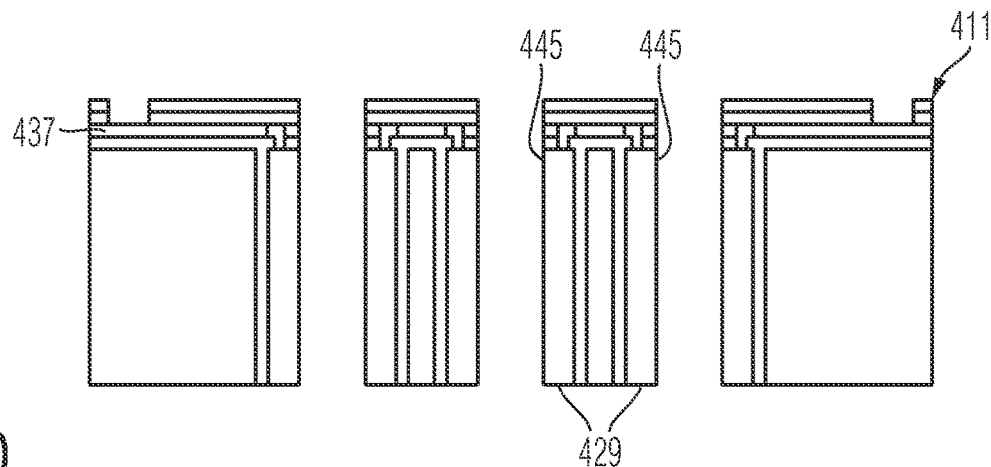

Afterwards, the insulator layer 417 is removed, and the insulation layers 427 on the inner walls of the holes 445 are likewise removed (cf. FIG. 3O). The removal of the insulator layer 417 and of the insulation 427 on the inner walls of the holes 445 can be carried out by etching using liquid or vaporous acid. Apertures 445 are thus formed in the plate 411, the inner walls of the apertures being lined with conductive material 429 to form ring electrodes which can be contacted via conductor tracks 437.

Figure 4:
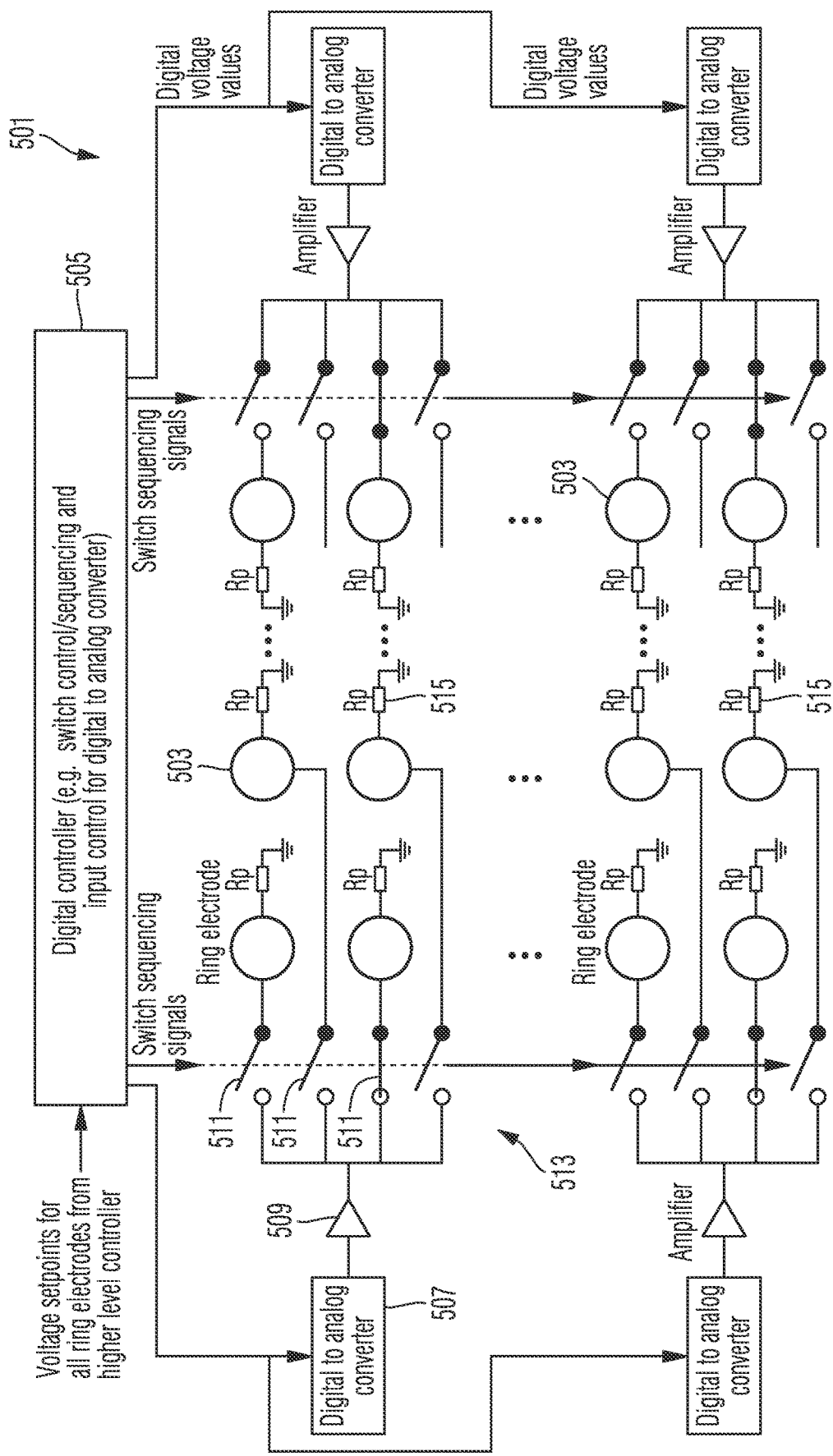
FIG. 4 shows a schematic illustration of a circuit of a voltage supply system.

FIG. 4 is a schematic illustration of a voltage supply system 501 for electrodes of multi-aperture plates. In the example shown in FIG. 4, the electrodes supplied by the voltage supply system 501 are ring electrodes 503 of the second multi-aperture plate 405. The voltage supply system 501 includes a signal generator 505 for generating a plurality of serial sequences of digital signals. Each of the serial sequences of digital signals is fed to one of a plurality of D/A converters 507. Each of the D/A converters 507 is responsible for the voltage supply of four electrodes 503. The D/A converter 507 converts the digital signal fed to it at a given point in time into an analogue voltage signal, which is amplified by an amplifier 509. The amplified voltage signal is fed to switches 511 of a changeover system 513. The switches 511 are connected to the output of the voltage amplifier 509 on one side and to one of the electrodes 503 on the other side. The signal generator 505 generates control signals for the changeover of the changeover system 513 in a manner synchronized with the sequences of digital signals. From the group of switches 511 (four switches 511 in the present example), at every point in time there is always exactly one switch 511 closed, while the other switches 511 are open. This means that at every point in time exactly one electrode 503 is connected to the output of the voltage amplifier 509, while the other electrodes 503 of the group are not connected to the output of the voltage amplifier 509. The switches 511 of a group of switches 511 are driven by the signal generator 505 in such a way that in order there is always a different switch 511 closed for a time duration corresponding to the duration during which a digital signal of the sequence of digital signals is present at the input of the D/A converter 507.

The electrodes 503 are electrically insulated from the substrate of the multi-aperture plate. Resistances between the electrodes 503 and the multi-aperture plate are represented by resistances 515 in FIG. 4, wherein the potential of the multi-aperture plate is represented as earth potential in FIG. 4. After a given electrode 503 has been connected via its switch 511 to the output of the voltage amplifier 509 and has been charged to the voltage output at the output of the voltage amplifier 509 and the switch 511 has thereupon been opened, the electrode 503 discharges via the resistance 515. The quantity of charge on the electrode 503 which is available for the discharge is given by the capacitance of the electrode 503 with respect to the multi-aperture plate. The capacitance together with the resistance 515 determines the discharge time constant for the discharge of the electrode 503. The intrinsic electrical capacitance of the system including electrode 503 with the underlying insulator layer forms a capacitor which is electrically connected to the electrode 503 on one side and to the multi-aperture plate on the other side. An increase in the discharge time constant is possible via an increase in the electrode capacitance. This can be effected for example via an electrode design with an enlarged electrode-insulator interface or by inserting a capacitance connected in parallel with the electrode. This additional capacitance can be realized as a MOS element (metal oxide semiconductor). The changeover frequency of the changeover system is chosen with a magnitude such that the fluctuations of the voltage present at the electrode 503 over the course of time are small enough to achieve a sufficiently constant influencing of the particle beam passing through the respective aperture. Furthermore, the digital signal which is converted by the D/A converter 507 and amplified by the voltage amplifier 509 before being fed to the electrode 503 is chosen such that the voltage at the electrode 503 on average over time corresponds to the predetermined voltage of the electrode 503.

In the voltage supply system 501 shown in FIG. 4, the voltage amplifier 509 is illustrated as separate from the D/A converter 507. However, it is also possible for the voltage amplifier 509 to be integrated into the D/A converter 507 and to form a component thereof.

In the voltage supply system 501 shown in FIG. 4, respective groups of four electrodes 503 are supplied by a D/A converter 507 and associated voltage amplifier 509. This number is by way of example. It is possible to supply a larger number of electrodes 503 of a multi-aperture plate or even all the electrodes 503 of the multi-aperture plate via a D/A converter and associated voltage amplifier.

In the voltage supply system 501 shown in FIG. 4, ring electrodes fitted around apertures through which particle beams pass are supplied in each case with predetermined voltages. However, it is also possible to supply other electrodes, such as, for example, the electrodes of the multi-aperture plate 507 which provide the effects of stigmators on the particle beams, via the voltage supply system.

Figure 5:
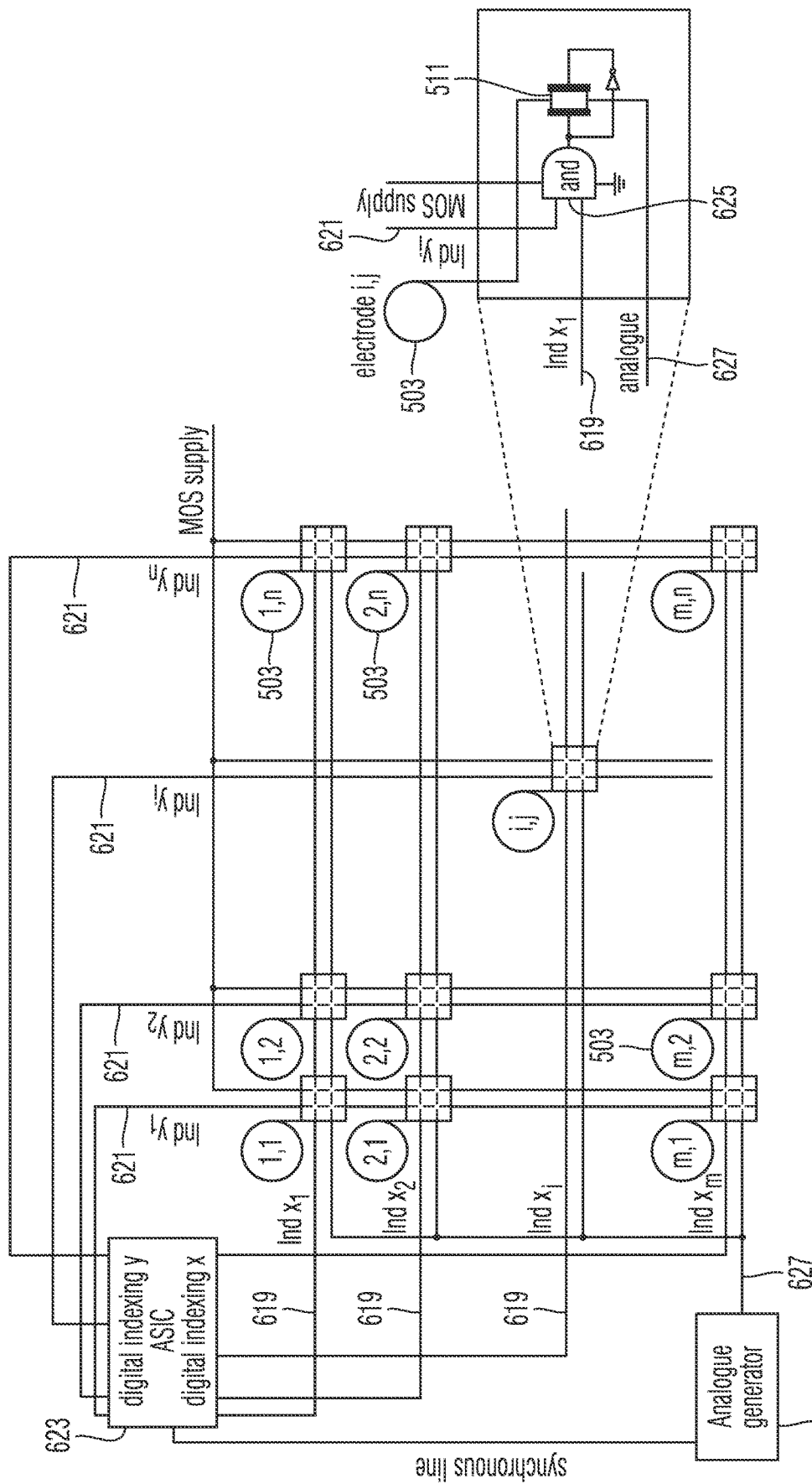
FIG. 5 shows a schematic illustration of a circuit of a voltage supply system.

FIG. 5 shows a variant of the voltage supply system shown in FIG. 4 for supplying a multiplicity of electrodes 503 with voltages. In this case, the changeover system 513 is modified in comparison with FIG. 4 by virtue of the fact that the switches 511 connecting the electrodes 503 to an output of a D/A converter 507 or voltage amplifier 509 are arranged as a matrix and are addressable row by row and column by column therein. The individual electrodes 503 are addressed by an addressing circuit 623, which applies electrical potentials to row lines 619 and column lines 621. A respective electrode 503 is assigned to crossovers between the row lines 619 and column lines 621, wherein a logic AND circuit 625 ascertains whether the row line 619 and column line 621 leading to a given crossover in each case have a predetermined potential, whereupon the switch 511 feeds the potential provided by the D/A converter 507 via a line 627 to the electrode 503 until the respective row line 619 and column line 621 no longer both simultaneously have the predetermined potential.

The voltage supply systems explained with reference to FIGS. 5 and 6 can also be used in other technological fields in which a relatively large number of elements are to be supplied with quite high voltages. By way of example, voltage supply systems of this type can be used for driving mirrors in an array of mirrors in an EUV lithography system as described for example in WO 2010/040506 A1.

Figure 6:
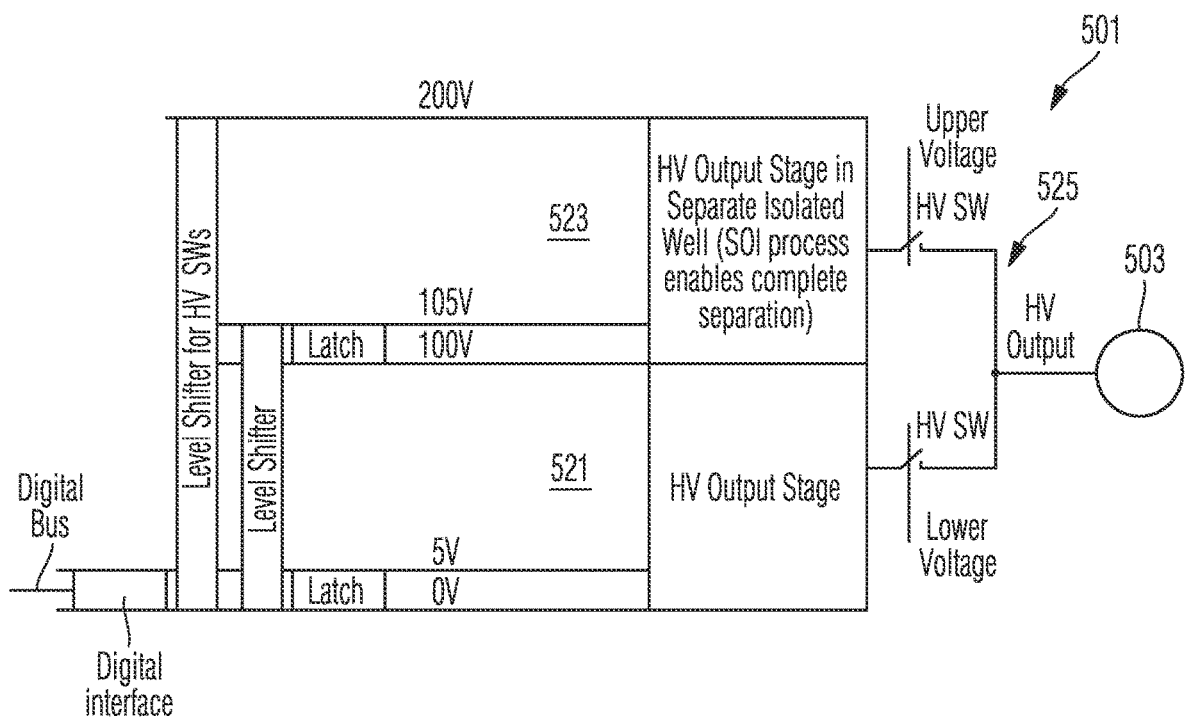
FIG. 6 shows a schematic illustration of a circuit of a voltage supply system.

FIG. 6 shows a further variant of the voltage supply system 501 shown in FIG. 4. In this case, two voltage amplifiers are provided for supplying an electrode 503 with voltage. A high voltage of 100 V is fed to a first voltage amplifier 521 as an operating voltage. A high voltage of 200 V is fed to a second voltage amplifier 523 as an operating voltage. The first voltage amplifier 521 amplifies an input voltage of between 0 V and 5 V into an output voltage of between 0 V and 100 V. The second voltage amplifier 523 amplifies an input voltage of between 0 V and 5 V into an output voltage of between 0 V and 200 V. If the voltage to be fed to the electrode 503 lies between 0 V and 100 V, the first voltage amplifier 521 is selected for feeding the voltage to the electrode 503 via a changeover switch 525. The second voltage amplifier 523 is then not connected to the electrode 503. In this case, the second voltage amplifier 523 can even be switched off. If the voltage to be fed to the electrode 503 lies between 100 V and 200 V, the second voltage amplifier 523 is used for feeding the voltage to the electrode 503 by virtue of the output of the voltage amplifier being connected to the electrode 503 via the changeover switch 525. The first voltage amplifier 521 is then not connected to the electrode 503 and can even be switched off.

Figure 7:
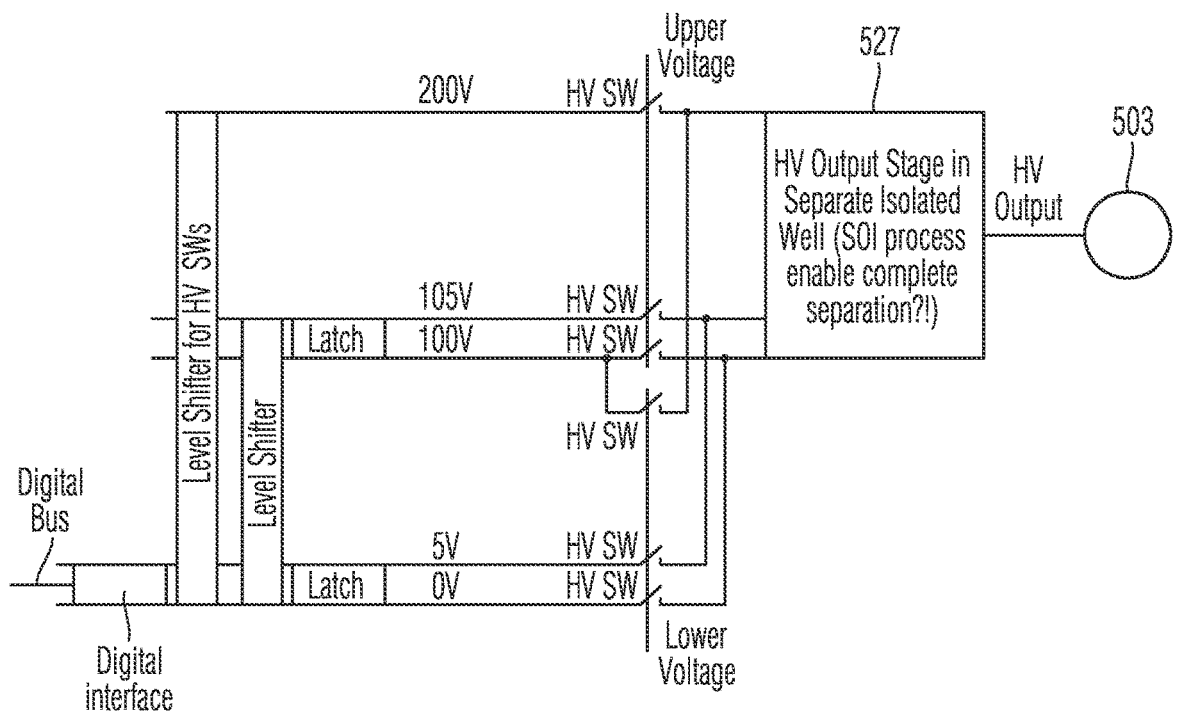
FIG. 7 shows a schematic illustration of a circuit of a voltage supply system.

FIG. 7 shows a variant of the voltage supply system shown in FIG. 6. In FIG. 7, rather than two separate voltage amplifiers, a single voltage amplifier 527 is used, to which an operating voltage of 100 V or 200 V is optionally fed depending on whether the voltage to be fed to the electrode 503 lies between 0 V and 100 V or between 0 V and 200 V.

Figure 8:
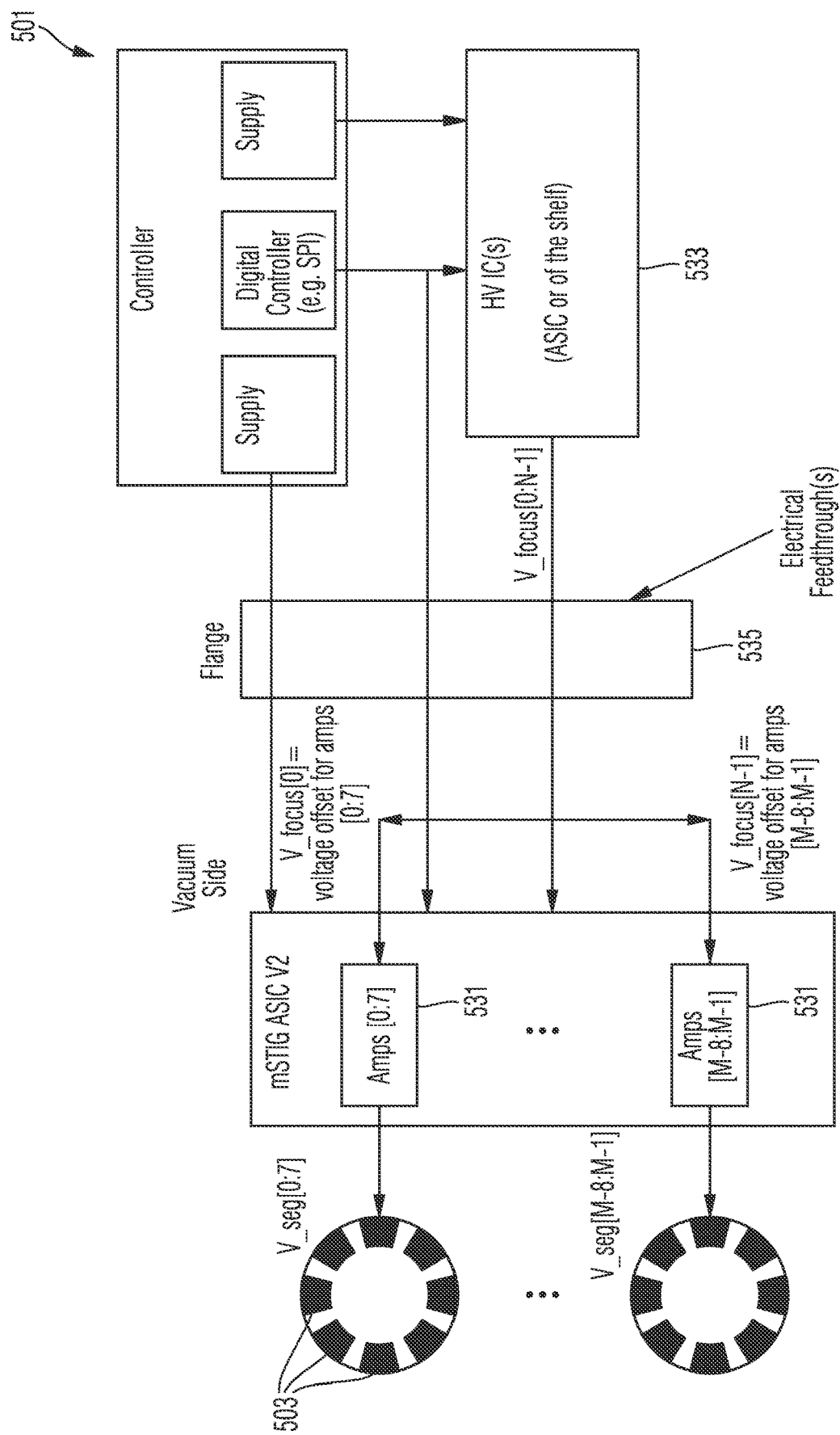
FIG. 8 shows a schematic illustration of a circuit of a voltage supply system.

FIG. 8 is a schematic illustration of a further embodiment of a voltage supply system for electrodes on multi-aperture plates in multi-beam particle beam systems. In the case of the system including a plurality of multi-aperture plates as explained with reference to FIG. 2, the second multi-aperture plate 405 has ring electrodes at apertures in order to have a focusing effect on the particle beams passing through the aperture, and the third multi-aperture plate 407 has apertures with in each case eight electrodes arranged in a manner distributed around the aperture in the circumferential direction in order to have the effect of a stigmator on the particle beams passing through the aperture. In the case of the voltage supply system 501 in FIG. 8, eight electrodes 503 arranged in a manner distributed around an aperture in the circumferential direction are used not only to have the effect of a stigmator on the particle beam passing through the aperture, but also to have a focusing effect on the beam. This last is achieved by virtue of the fact that the mean value of the voltages applied to the eight electrodes 503 is altered. The effect as a stigmator is set by altering voltage differences between the eight electrodes. By maintaining these voltage differences, however, the mean value of the voltages of the eight electrodes is altered in order to alter the focusing effect. For this purpose, the voltage supply system 501 includes a plurality of supply circuits 531, wherein each supply circuit 531 is configured to feed settable voltage differences to the eight electrodes 503 of an aperture. For this purpose, the supply circuits 531 can operate according to the principles as have been explained above with reference to FIGS. 3 and 4.

Furthermore, a supply circuit 533 is provided which is configured to feed an operating voltage set by the supply circuit 533 to each of the supply circuits 531 in order thereby to set the mean value of the voltages at the eight electrodes 503 of an aperture to a value predefined by the supply circuit 533. The voltages output by the supply circuit 533 typically lie for example between 0 V and 200 V, while the voltages output by the voltage supply circuits 531 typically lie in the range of between 0 V and 10 V.

In specific embodiments, the supply circuit 533 can be arranged outside a vacuum jacket 535 of the multi-beam particle beam system, and the voltages provided by the supply circuit 533 can be guided by suitable vacuum brushings through the vacuum jacket 535 and be fed to the circuits 531 in the interior of the vacuum jacket 535. The circuits 531 can be integrated into the multi-aperture plates.

Figure 10:
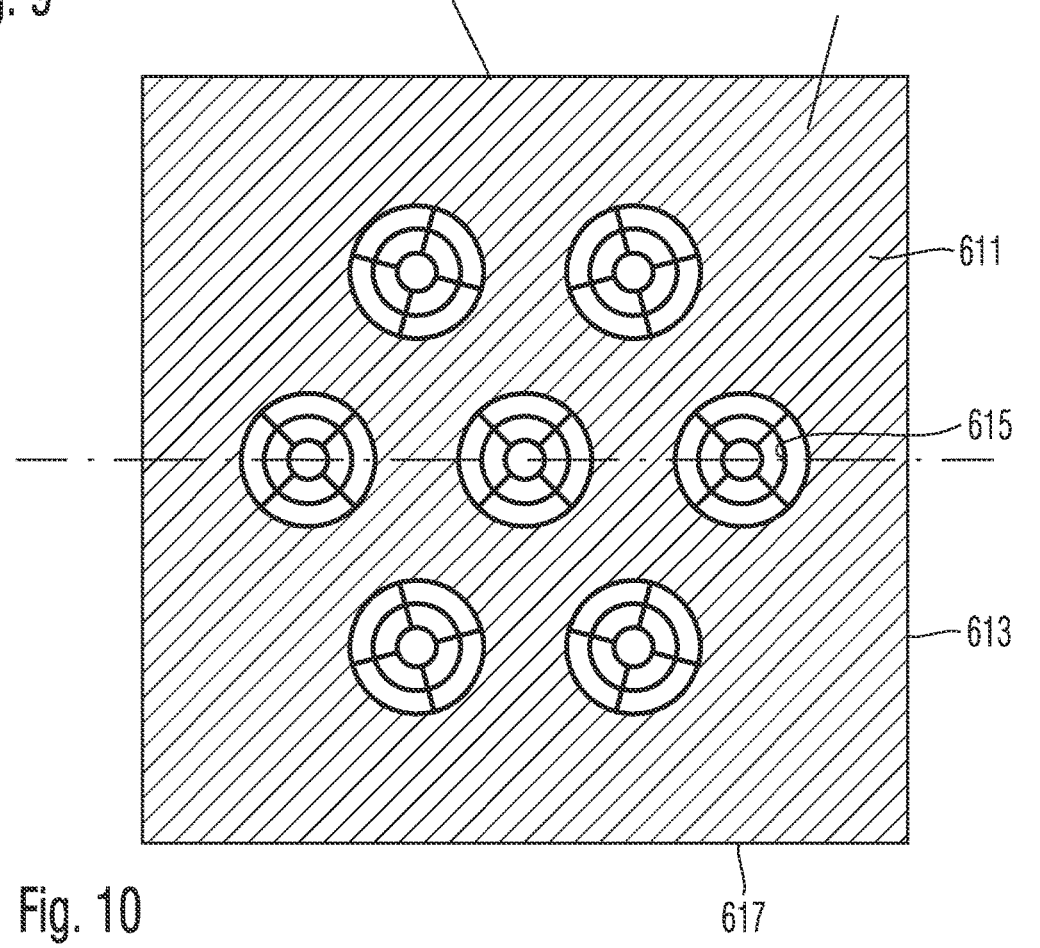
FIG. 10 shows a cross-sectional illustration of the multi-aperture plate shown in FIG. 9 along a line X-X in FIG. 9.

FIG. 9 shows a sectional illustration through a multi-aperture plate in accordance with a further embodiment, and FIG. 10 shows a sectional illustration along the line X-X in FIG. 9. The multi-aperture plate 601 is provided for providing apertures 603 which have a settable focusing effect on the particle beams 605 passing through the apertures 603. For this purpose, the multi-aperture plate 601 includes an upper partial plate 607 and a lower partial plate 609, between which an electrode layer 611 is arranged. The electrode layer 611 is illustrated in plan view in FIG. 10. It includes an insulating layer 613 having the apertures 603, wherein an electrode network 615 is arranged within each of the apertures 603. The electrode network 615 includes a plurality of struts arranged within the aperture 603 such that they are struck by the particle beams 605. The total cross section of the struts thus leads to a loss of particles of the particle beam. However, the total area of the struts is small in comparison with the total cross section of the aperture, and so the loss of particles of the particle beam upon passing through the electrode layer is small enough that it remains within bounds tenable for the application of the multi-beam particle beam system. In the example illustrated, the struts have the geometry of two circles and four radial segments. Other geometries are possible. The struts of the grid electrodes can be connected to settable potentials via grid lines 617 from a voltage system that is not illustrated in FIG. 10. By changing the potential of the grid electrode, it is possible to set the focusing effect that the grid electrode has on the particle beam 605. The intensity of the focusing effect furthermore depends on distances separating the upper plate 607 and the lower plate 609 from the grid electrode. In the illustration in FIG. 9, the upper plate 607 is arranged at a distance d from the grid electrode layer 611, while the lower plate 609 is at substantially no distance from the layer.

In an alternative embodiment to the embodiment in FIG. 4, for each electrode 503 a dedicated sample-and-hold circuit can be provided between the switch 511 and the electrode 503. Such a sample-and-hold circuit can be constructed from an operational amplifier, the input of which is connected to the output of the switch 511 and the output of which is connected to the electrode 503. The output signal can be fed back to the inverting input. The intrinsic capacitance between the electrical line from the switch 511 to the input of the operational amplifier, together with the creepage current via the switch 511, then defines the discharge rate and thus the required changeover frequency. Since the creepage current via the open switch 511 can be less than the creepage current of the electrode 503, in this embodiment the changeover frequency can be chosen to be lower and the number of electrodes 503 supplied with an analogue voltage signal by a single D/A converter can correspondingly be greater.

In a further alternative embodiment to the embodiment in FIG. 4, the signal generator 505 embodied as a digital controller can have a memory in which the digital output signal assigned from the digital input signal is stored for each electrode. It is then possible either to provide a dedicated D/A converter for each electrode 503, the input signal of which D/A converter is the stored digital signal assigned to the respective electrode. Alternatively, as in the embodiment in FIG. 4, a single D/A converter can be present, the analogue output signal of which is fed to the individual electrodes 503 temporally sequentially via a switch 511 and to the input of which is fed, synchronously with respect to the changeover of the switch 511, the stored digital output signal assigned to the electrode respectively connected to the output of the D/A converter. In an embodiment including a digital memory, the D/A converter (or the D/A converters) can also be embodied as current-controlling D/A converters in which the input-side digital signal defines an output-side current intensity. The intrinsic resistance between the driven electrode and an earth potential then defines the electrical voltage present at the electrode.

As an alternative to a cable-based transmission of the digital signal to the signal generator 505, a wireless signal transmission via RF signals, in an inductive manner or in an optical manner is also possible. In these cases, the signal generator 505 additionally has a corresponding receiver for signals transmitted wirelessly, such as an RF receiver or an optical detector.

What is claimed is:
1. A multi-aperture plate, comprising:
a silicon layer;
an insulation layer disposed on the silicon layer;
a plurality of apertures each extending through the silicon layer and the insulation layer;

a conductive material disposed on a portion of an inner wall of each aperture defined by the silicon layer to define a ring electrode;

metal in openings in the insulation layer to define metal contacts electrically connected to one of the ring electrodes;

a plurality of conductor tracks disposed on the insulation layer;

a passivation layer covering the conductor tracks and portions of the insulation layer; and a metal layer disposed on the passivation layer, wherein the conductor tracks are connected to the metal contacts so that voltages are suppliable to the ring electrodes via the conductor tracks.

2. The multi aperture plate of claim 1, wherein the silicon layer has a thickness of 200 μm to 300 μm.

3. The multi aperture plate of claim 1, wherein the silicon layer has a thickness about equal to a height of the ring electrodes.

4. The multi aperture plate of claim 1, further comprising an insulating layer between the inner wall of each aperture defined by the silicon layer and the conductive material.

5. The multi aperture plate of claim 4, wherein the insulating layer comprises $SiO_2$.

6. A particle beam system, comprising:
a particle source configured to generate a particle beam;
a multi-aperture plate according to claim 1; and
an objective lens system comprising a particle-optical lens.

7. A particle beam system, comprising:
a particle source configured to generate a particle beam;
a multi-aperture arrangement, comprising:
a first multi-aperture plate configured to split the particle beam generated by the particle source into a multiplicity of particle beams; and
a second multi-aperture plate downstream of the first multi-aperture plate; and
an objective lens system comprising a particle-optical lens to focus the multiplicity of particle beams at an object plane;
wherein the second multi-aperture plate comprises:
a silicon layer;
an insulation layer disposed on the silicon layer;
a plurality of apertures each extending through the silicon layer and the insulation layer;
a conductive material disposed on a portion of an inner wall of each aperture defined by the silicon layer to define a ring electrode;
metal in openings in the insulation layer to define metal contacts electrically connected to one of the ring electrodes;
a plurality of conductor tracks disposed on the insulation layer;
a passivation layer covering the conductor tracks an portions of the insulation layer; and
a metal layer disposed on the passivation layer,
wherein the conductor tracks are connected to the metal contacts so that voltages are suppliable to the ring electrodes via the conductor tracks.

8. The particle beam system of claim 7, wherein the silicon layer has a thickness of 200 μm to 300 μm.

9. The particle beam system of claim 7, wherein the silicon layer has a thickness about equal to a height of the ring electrodes.

10. The particle beam system of claim 7, further comprising an insulating layer between the inner wall of each aperture defined by the silicon layer and the conductive material.

11. The particle beam system of claim 8, wherein the insulating layer comprises $SiO_2$.

12. The particle beam system of claim 7, further comprising:
a detection system comprising an electron optical unit which comprises a projection lens configured to direct electron beams onto an electron multi-detector; and
a beam switch in the beam path between the second multi-aperture plate and the objective lens system.

13. The particle beam system of claim 7, further comprising a voltage supply system comprising:
a signal generator configured to generate a plurality of serial sequences of digital signals;
a plurality of D/A converters;
a voltage amplifier having an output; and
a group of switches,
wherein:
each switch is connected between the output of the voltage amplifier and one of the electrodes; and
the group of switches is configured to be driven by the signal generator so that that there is always a different switch closed for a time duration corresponding to a duration in which a digital signal of the sequence of digital signals is present at the input of the D/A converter so that at every point in time there is always exactly one switch closed while the other switches are open.

14. The particle beam system of claim 13, wherein the electrode has an increased electrode capacitance via an enlarged electrode-insulator interface or via an inserted capacitance parallel to the capacitance.

15. The particle beam system of claim 14, wherein the inserted capacitance comprises a MOS element.

16. The particle beam system of claim 13, wherein the group of switches defines a matrix that is addressable row by row and column by column, and the particle beam system further comprises an addressing circuit configured to address the individual electrodes.

17. The particle beam system of claim 13, wherein the voltage supply system further comprises a plurality of sample-and-hold circuits, and each sample-and-hold circuit is connected between one the plurality of switches and one of the electrodes.

18. The particle beam system of claim 13, further comprising a third multi-aperture plate having a plurality of apertures, wherein:
each aperture of the third multi-aperture plate comprises eight electrodes distributed around the aperture in a circumferential direction;
the voltage supply system includes a plurality of supply circuits; and
each supply circuit is configured to provide settable voltages to the eight electrodes of an aperture of the plurality of apertures.

19. The particle beam system of claim 18, wherein each supply circuit is configured to set the voltages of the eight electrodes of the aperture so that they provide a stigmatic effect on a particle beam traversing the aperture during operation of the particle beam system.

20. The particle beam system of claim 18, wherein each supply circuit is configured to set the voltages of the eight electrodes of the aperture so that they provide a focusing effect on a particle beam traversing the aperture during operation of the particle beam system.

21. The particle beam system of claim 18, wherein each supply circuit is configured to set the voltages of the eight electrodes of the aperture so that they provide both a stigmatic effect and a focusing effect on a particle beam traversing the aperture during operation of the particle beam system.

\* \* \* \* \*